United States Patent
Ota

(10) Patent No.: US 9,819,888 B2
(45) Date of Patent: Nov. 14, 2017

(54) IMAGE PICKUP DEVICE, IMAGE PICKUP SYSTEM, DRIVING METHOD FOR IMAGE PICKUP DEVICE, AND DRIVING METHOD FOR IMAGE PICKUP SYSTEM

(71) Applicant: CANON KABUSHIKI KAISHA, Tokyo (JP)

(72) Inventor: Keisuke Ota, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 83 days.

(21) Appl. No.: 14/553,581

(22) Filed: Nov. 25, 2014

(65) Prior Publication Data

US 2015/0156435 A1    Jun. 4, 2015

(30) Foreign Application Priority Data

Nov. 29, 2013 (JP) ................. 2013-248032

(51) Int. Cl.
| | |
|---|---|
| *H04N 5/378* | (2011.01) |
| *H04N 5/3745* | (2011.01) |
| *H03M 1/06* | (2006.01) |
| *H03M 1/12* | (2006.01) |
| *H03M 1/56* | (2006.01) |

(52) U.S. Cl.
CPC .......... *H04N 5/378* (2013.01); *H03M 1/0634* (2013.01); *H04N 5/37455* (2013.01); *H03M 1/123* (2013.01); *H03M 1/56* (2013.01)

(58) Field of Classification Search
CPC .... H04N 5/357; H04N 5/3575; H04N 5/3577; H04N 5/361; H04N 5/363; H04N 5/365–5/3658; H04N 5/378; H03M 1/0634–1/0673; H03M 1/12–1/645
See application file for complete search history.

(56) References Cited

U.S. PATENT DOCUMENTS

| | | | |
|---|---|---|---|
| 2008/0001802 A1* | 1/2008 | Higuchi ................. | H04N 5/357 341/155 |
| 2011/0074994 A1* | 3/2011 | Wakabayashi ...... | H03M 1/0658 348/302 |
| 2015/0162929 A1* | 6/2015 | Shinozuka ............. | H04N 5/378 348/294 |

FOREIGN PATENT DOCUMENTS

JP    2012-004727 A    1/2012

* cited by examiner

*Primary Examiner* — Paul Berardesca
(74) *Attorney, Agent, or Firm* — Canon USA, Inc. IP Division

(57) ABSTRACT

In an image pickup device, in a period for which a signal value of the comparison result signal is changed in a certain AD converter among a plurality of AD converters, the signal value of the comparison result signal changes a plurality of times in another AD converter.

18 Claims, 12 Drawing Sheets

TO HORIZONTAL
SCANNING CIRCUIT 107

IMAGE PICKUP DEVICE, IMAGE PICKUP SYSTEM, DRIVING METHOD FOR IMAGE PICKUP DEVICE, AND DRIVING METHOD FOR IMAGE PICKUP SYSTEM

BACKGROUND OF THE INVENTION

Field of the Invention

The present invention relates to an image pickup device, an image pickup system, a driving method for an image pickup device, and a driving method for an image pickup system.

Description of the Related Art

As an image pickup device including an AD converter for each column (an AD converter provided for each column is hereinafter referred to as a column ADC) in a CMOS image sensor (may also referred to as a CMOS sensor) used in a recent digital camera, an image pickup device disclosed in Japanese Patent Application Laid-Open No. 2012-004727 has been known.

In the image pickup device according to Japanese Patent Application Laid-Open No. 2012-004727, the column ADCs average the results of sampling the reset level signals of the pixels a plurality of times. Thus, the image pickup device according to Japanese Patent Application Laid-Open No. 2012-004727 outputs the signal in which the lower random noise caused in the pixels and the column ADCs is reduced.

However, in the image pickup device according to Japanese Patent Application Laid-Open No. 2012-004727, an analog signal is subjected to the AD conversion a plurality of times for reducing the random noise; therefore, the AD conversion time has been long.

SUMMARY OF THE INVENTION

According to an aspect of the present invention, an image pickup device includes: a plurality of pixels arranged in a plurality of columns and each outputting a signal based on incident light; a plurality of AD converters each disposed in accordance with each column of the pixels and generating a digital signal based on the signal output from the pixel; and a control unit having a ramp signal output unit that outputs a ramp signal whose potential changes depending on time to the plurality of AD converters, wherein: each of the plurality of AD converters has a comparator that generates a comparison result signal by comparing the ramp signal and a signal output from the pixel; and in a period for which a signal value of the comparison result signal is changed by comparing the ramp signal and the signal output from the pixel in a certain AD converter among the plurality of AD converters, the signal value of the comparison result signal changes a plurality of times by comparing the ramp signal and the signal output from the pixel in another AD converter.

Another aspect of the present invention is an image pickup system including an image pickup device including: a plurality of pixels arranged in a plurality of columns and each outputting a signal based on incident light; a plurality of AD converters each disposed in accordance with each column of the pixels and generating a digital signal based on the signal output from the pixel; and a control unit having a ramp signal output unit that outputs a ramp signal whose potential changes depending on time to the plurality of AD converters, wherein: each of the plurality of AD converters has a comparator that generates a comparison result signal by comparing the ramp signal and a signal output from the pixel, and a counter that generates a count signal obtained by counting a clock signal in a period for which the comparison is made; in a period for which a signal value of the comparison result signal is changed by comparing the ramp signal and the signal output from the pixel in a certain AD converter among the plurality of AD converters, the signal value of the comparison result signal changes a plurality of times by comparing the ramp signal and the signal output from the pixel in another AD converter; the counter of the other AD converter is a counter that integrates the count signal for every comparison; the image pickup device includes an output unit that outputs the count signal integrated by the counter of the other AD converter to a signal processing unit; and the image pickup system includes the signal processing unit that generates a signal obtained by dividing the count signal integrated by the counter of the other AD converter by the number of times of changes of the signal value of the comparison result signal of the other AD converter.

Another aspect of the present invention is a driving method for an image pickup device including: a plurality of pixels arranged in a plurality of columns and each outputting a signal based on incident light; and a plurality of AD converters each disposed in accordance with each column of the pixels and generating a digital signal based on the signal output from the pixel, wherein: each of the plurality of AD converters includes a comparator that generates a comparison result signal based on comparison between a ramp signal whose potential changes depending on time and a signal output from the pixel; and in a period for which a signal value of the comparison result signal is changed by comparing the ramp signal and the signal output from the pixel in a certain AD converter among the plurality of AD converters, the signal value of the comparison result signal changes a plurality of times by comparing the ramp signal and the signal output from the pixel in another AD converter.

Yet another aspect of the present invention is a driving method for an image pickup system including an image pickup device including: a plurality of pixels arranged in a plurality of columns and each outputting a signal based on incident light; and a plurality of AD converters each disposed in accordance with each column of the pixels and generating a digital signal based on the signal output from the pixel, wherein: each of the plurality of AD converters has a comparator that generates a comparison result signal based on comparison between a ramp signal whose potential changes depending on time and signals output from the pixels, and a counter that generates a count signal obtained by counting a clock signal in a period for which the comparison is made; in a period for which a signal value of the comparison result signal is changed by comparing the ramp signal and the signal output from the pixel in a certain AD converter among the plurality of AD converters, the signal value of the comparison result signal changes a plurality of times by comparing the ramp signal and the signal output from the pixel in another AD converter; the counter of the other AD converter integrates the count signal every time the signal value of the comparison result signal of the other AD converter changes; and a signal is generated that is obtained by dividing the count signal integrated by the counter of the other AD converter by the number of times of changes of the signal value of the comparison result signal of the other AD converter.

Further features of the present invention will become apparent from the following description of exemplary embodiments (with reference to the attached drawings).

DESCRIPTION OF THE EMBODIMENTS

Embodiments of an image pickup device are hereinafter described with reference to the drawings.

First Embodiment

Figure 1:
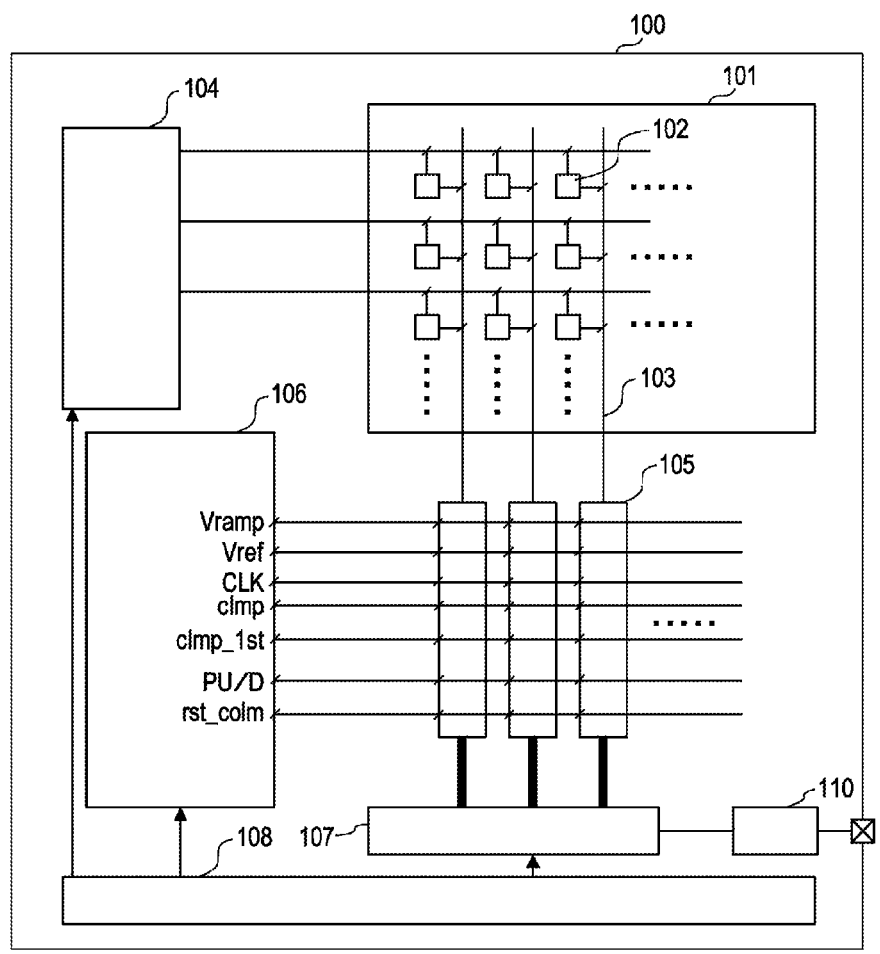
FIG. 1 is a diagram illustrating an example of a structure of an image pickup device.

FIG. 1 is a diagram illustrating a structure of an image pickup device 100 of this embodiment. The image pickup device 100 includes a pixel portion 101 where pixels 102 outputting signals based on incident light are disposed in a plurality of columns and a plurality of rows, and a vertical scanning circuit 104 that selects and sequentially scans a pixel row for outputting signals. Moreover, the image pickup device 100 includes a vertical signal line 103 to which the signal is input from the pixel 102 selected by the vertical scanning circuit 104, column circuits 105 that process the signals input from the vertical signal line 103, and a column circuit control unit 106 that controls the column circuits. Furthermore, the image pickup device 100 includes a horizontal scanning circuit 107 that sequentially reads out the signals processed in the column circuits 105 by each column of the column circuits 105. In addition, the image pickup device 100 includes a timing control unit 108 that controls the timing of operating the vertical scanning circuit 104, the column circuit control unit 106, and the horizontal scanning circuit 107. Moreover, the image pickup device 100 includes an output unit 110.

The column circuit control unit 106 outputs a ramp signal Vramp, a reference voltage Vref, and a clock signal CLK to each of the column circuits 105. The column circuit control unit 106 outputs a signal clmp, a signal clmp_1st, a signal PU/D, and a signal rst_colm to each of the column circuits 105. The column circuit control unit 106 of this embodiment corresponds to a ramp signal output unit that outputs the ramp signal Vramp.

Figure 2A:
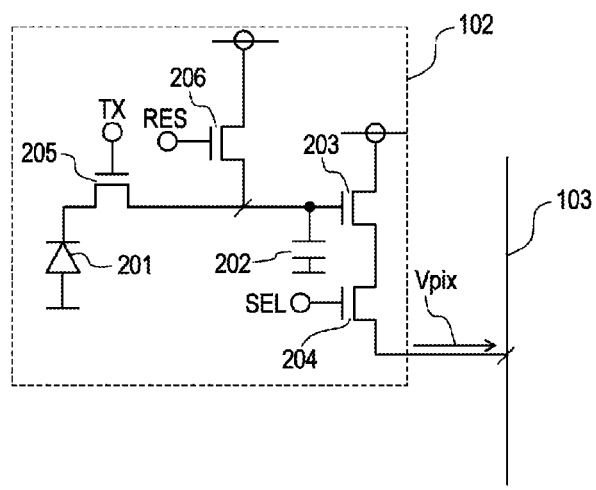
FIGS. 2A and 2B are diagrams illustrating an example of a structure of a pixel and an example of an operation of the pixel.

FIG. 2A is a diagram illustrating a structure of the pixel 102. The pixel 102 includes a photodiode 201 that converts the incident light into a charge, a floating diffusion capacitor 202 that holds the charge, and a transistor 203 that outputs a signal based on the charge of the floating diffusion capacitor 202. The pixel 102 further includes a transistor 204 that switches the supply and the non-supply of a power source voltage VDD to the transistor 203, and a transistor 205 that transfers the charge of the photodiode 201 to the floating diffusion capacitor 202. The pixel 102 moreover includes a transistor 206 that resets the charge of the floating diffusion capacitor 202. To the transistor 204, the transistor 205, and the transistor 206, a signal SEL, a signal TX, and a signal RES are respectively input sequentially from the vertical scanning circuit 104. The signal output from the transistor 203 to the vertical signal line 103 through the transistor 204 is expressed as a signal Vpix.

Figure 2B:
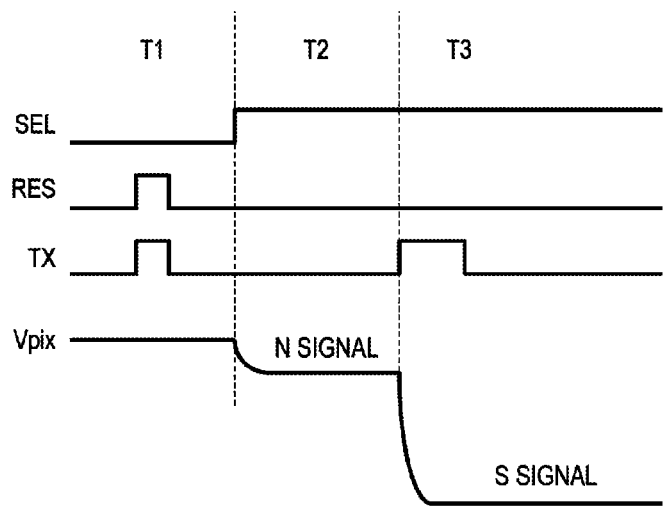

FIG. 2B is a timing chart of the operation of the pixel 102. In the pixel 102, a signal RES and a signal TX at a high level (hereinafter referred to as an H level) are input from the vertical scanning circuit 104 to the transistor 206 and the transistor 205, respectively in a period T1. This turns on the transistor 206 and the transistor 205, whereby the photodiode 201 and the floating diffusion capacitor 202 are reset to the potential based on the power source voltage VDD. After that, the signal SEL at the H level is input to the transistor 204 from the vertical scanning circuit 104 in a period T2, thereby turning on the transistor 204. Thus, the signal Vpix becomes the reset level signal (hereinafter referred to as an N signal). Subsequently, in a period T3, the signal TX at the H level is input from the vertical scanning circuit 104 to the transistor 205, thereby turning on the transistor 205. Then, the charges accumulated in the photodiode 201 are transferred to the floating diffusion capacitor 202. Thus, the transistor 203 outputs the signal based on the charges accumulated by the photodiode 201 and transferred to the floating diffusion capacitor 202 overlapping on the N signal. The signal Vpix output from the transistor 203 to the vertical signal line 103 through the transistor 204 on this occasion is expressed as the S signal.

Figure 3:
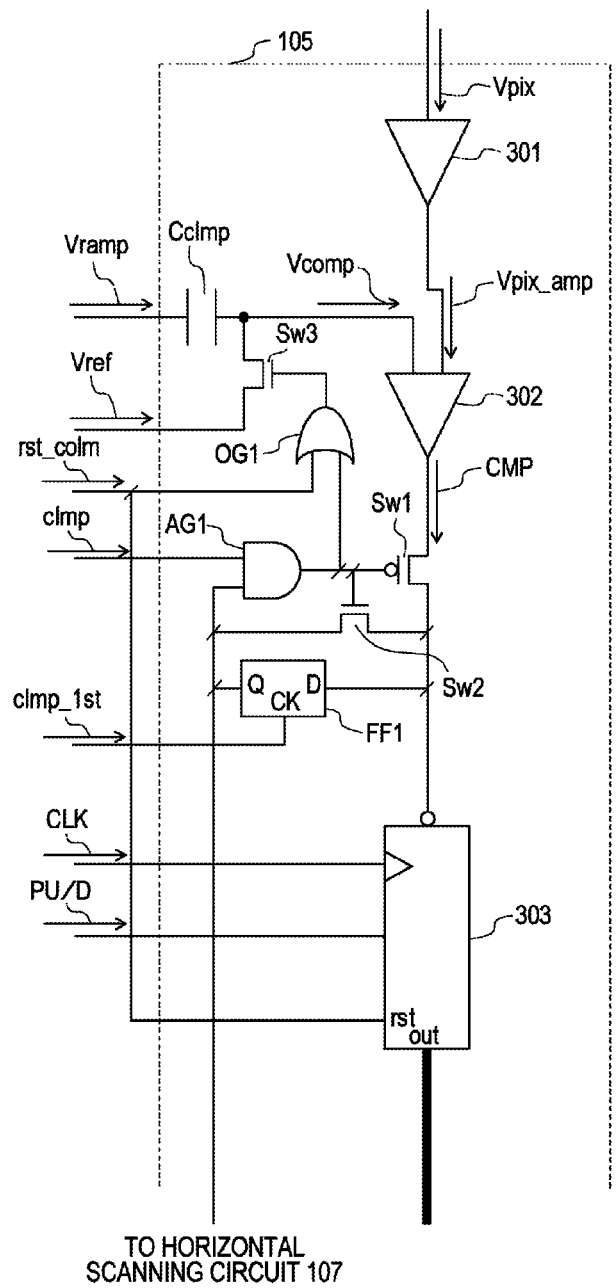
FIG. 3 is a diagram illustrating an example of a structure of a column circuit.

FIG. 3 is a diagram illustrating a structure of the column circuit 105. The column circuit 105 includes an amplifier 301, a comparator 302, and a counter 303. The column circuit 105 further includes a switch Sw1, a switch Sw2, a switch Sw3, a flipflop circuit FF1, an AND circuit AG1, an OR circuit OG1, and a clamp capacitor Cclmp. In FIG. 3, the signal input from the column circuit control unit 106 to the column circuit 105 is denoted by the same reference symbol as that of FIG. 1. To the comparator 302, the ramp signal Vramp is input through the clamp capacitor Cclmp. The ramp signal input to the comparator 302 is expressed as the ramp signal Vcomp. The amplifier 301 outputs the signal Vpix_amp obtained by amplifying the signal Vpix to the comparator 302. The comparator 302 outputs a comparison result signal CMP representing the result of comparing the ramp signal Vcomp and the signal Vpix_amp to the switch Sw1, the switch Sw2, the flipflop circuit FF1, and the counter 303. An AD converter of this embodiment includes the comparator 302, the counter 303, the switch Sw1, the switch Sw2, the switch Sw3, the flipflop circuit FF1, the AND circuit AG1, the OR circuit OG1, and the clamp capacitor Cclmp. The counter 303 is switched in regard to whether a counted value is increased or decreased by the signal PU/D. The counter 303 counts based on the clock signal CLK while the L-level comparison result signal CMP is input to the input terminal of the counter 303 that is connected to the output terminal of the comparator 302 through the switch Sw1. On the contrary, the counter 303 does not count while the H-level comparison result signal CMP is input to the input terminal.

Figure 4:
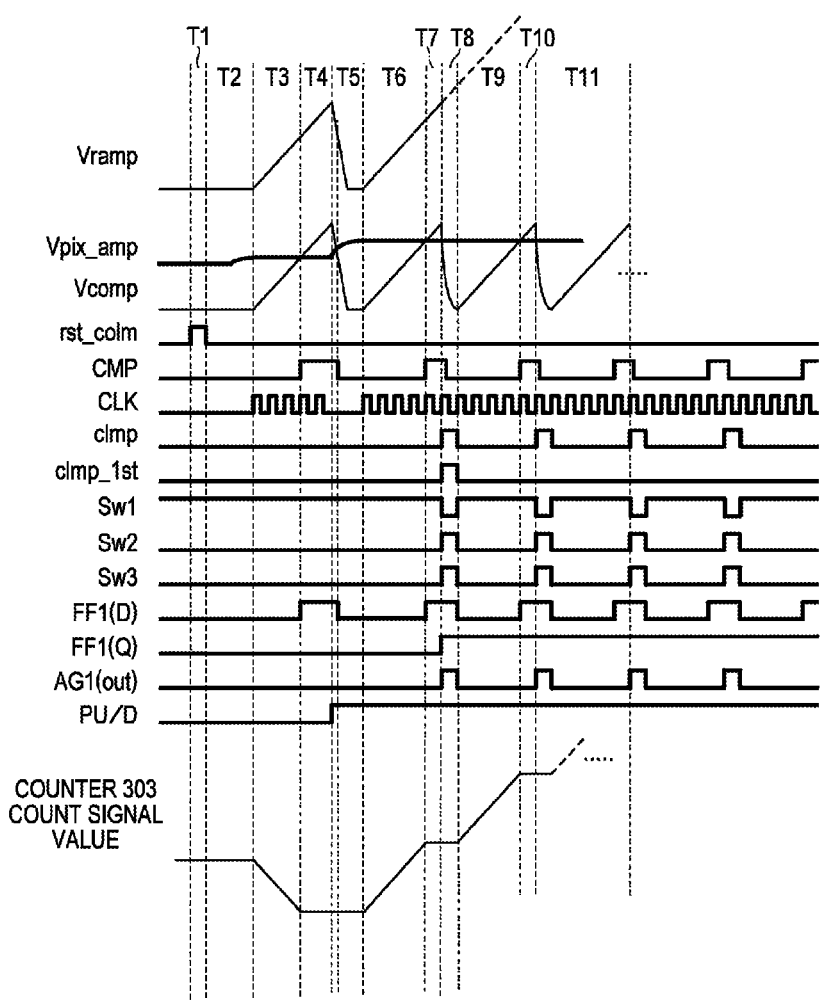
FIG. 4 is a diagram illustrating an example of an operation of the image pickup device.
Figure 5:
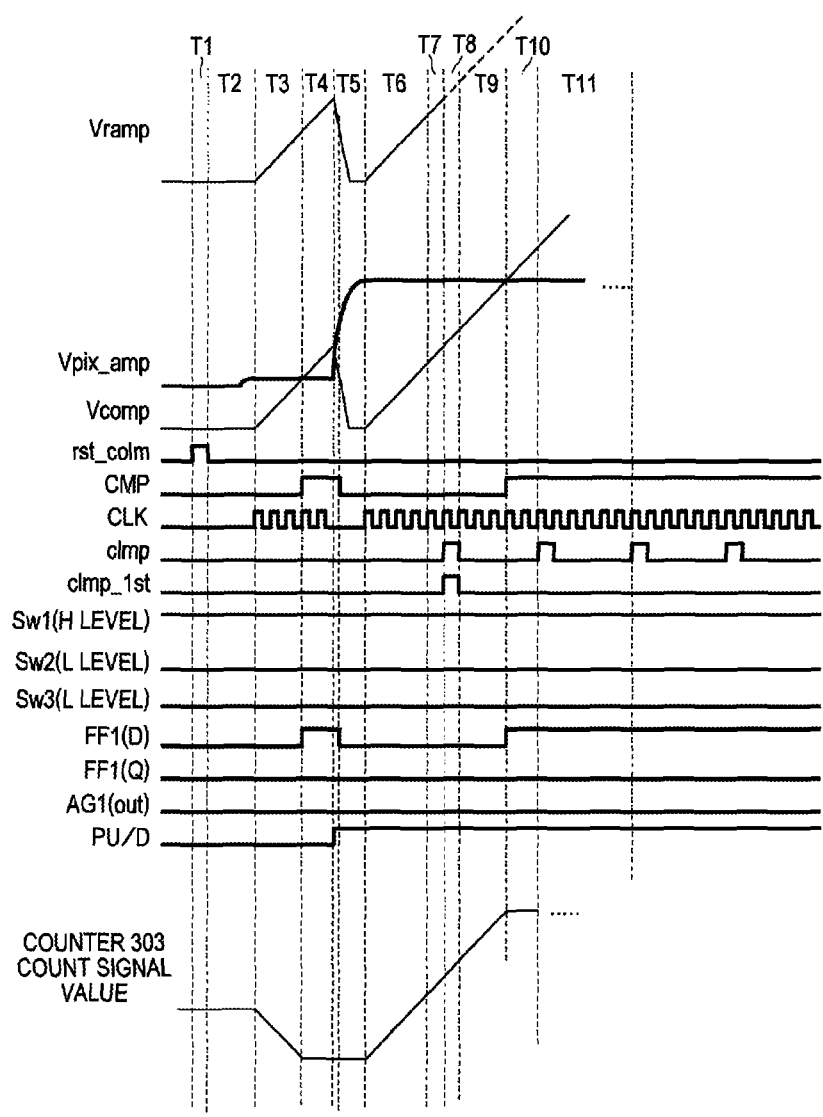
FIG. 5 is a diagram illustrating an example of the operation of the image pickup device.

Since the S signal is generated based on the incident light in each pixel 102, the signal level of the S signal output from the pixel 102 is changed depending on the light quantity. Therefore, in the column circuits 105, the signal level of the amplified S signals may vary. FIG. 4 illustrates the operation of the column circuit 105 in the case where the S signal of the pixel 102 with the small incident light quantity is input. FIG. 5 illustrates the operation of the column circuit 105 in the case where the S signal of the pixel 102 with the large incident light quantity is input.

FIG. 4 is a timing chart illustrating the operation of the column circuit 105 illustrated in FIG. 3. The reference symbols in FIG. 4 correspond to those of FIG. 3. The switch Sw1, the switch Sw2, and the switch Sw3 in FIG. 4 are on at the H level and off at the L level.

First, in the period T1 in FIG. 4, the H-level signal rst_colm is input to the column circuit 105. This resets the counted value of the counter 303 to the initial value. At the same time, the switch Sw3 is turned on through the OR circuit OG1 and the potential of the node connected to the comparator 302 of the clamp capacitor Cclmp at the reference voltage Vref.

In the period T2 in FIG. 4, the pixel row is selected by the vertical scanning circuit 104 and the output of the signal Vpix_amp is changed. The pixel 102 outputs the N signal to the amplifier 301 through the vertical signal line 103. The amplifier 301 outputs the signal obtained by amplifying the N signal. The signal Vpix_amp output from the amplifier 301 is expressed as the AMP_N signal.

In a period T3 in FIG. 4, the column circuit 105 performs the AD conversion on the AMP_N signal. The period T3 in FIG. 4 starts at the timing when the comparator 302 starts to compare the ramp signal Vcomp and the AMP_N signal. In this period, the column circuit control unit 106 sets the signal PU/D to be output to the counter 303 at the low level (hereinafter referred to as the L level). Thus, the counter 303 counts down the clock signal CLK in a manner that the count signal value decreases from the initial value. This counting operation of the counter 303 is referred to as countdown. On the contrary, the operation of the counter 303 counting up the clock signal CLK in a manner that the count signal value increases from the initial value is referred to as countup. Upon the start of the change in potential of the ramp signal Vramp depending on the time, the potential of the ramp signal Vcomp also changes with the same inclination as the ramp signal Vramp. At the time when the ramp signal Vcomp starts to change in potential, the comparison result signal CMP output from the comparator 302 is at the L level. Since the output of the AND circuit AG1 is at the L level, the switch SW1 is on. Therefore, the L-level comparison result signal CMP is output to the counter 303 through the switch Sw1. The counter 303 performs the count operation while the comparison result signal CMP is at the L level.

In a period T4 in FIG. 4, the potential of the ramp signal Vcomp is higher than that of the AMP_N signal. Therefore, the comparison result signal CMP is at the H level. The timing when the signal value of the comparison result signal CMP changes from the L level to the H level is the timing when the comparator 302 finishes comparing between the ramp signal Vcomp and the AMP_N signal. Thus, the counter 303 stops to count and holds the count signal at this time. On this occasion, the count signal held by the counter 303 is the digital signal based on the AMP_N signal.

Subsequently, in a period T5 in FIG. 4, the pixel 102 performs the operation of the period T3 illustrated in FIG. 2B. Thus, the pixel 102 outputs the S signal to the amplifier 301 through the vertical signal line 103. The column circuit control unit 106 returns the ramp signal Vramp to the initial value. Thus, the ramp signal Vcomp also returns to the initial value again. Accordingly, the comparison result signal CMP is at the L level. In the period T5 in FIG. 4, however, the clock signal CLK is not output; therefore, the count signal value of the counter 303 does not change. Moreover, the column circuit control unit 106 sets the signal PU/D to the H level in the period T5 in FIG. 4 and changes the counting operation of the counter 303 to countup. The amplifier 301 outputs the signal obtained by amplifying the S signal to the comparator 302. The signal obtained by amplifying the S signal and output by the amplifier 301 is expressed as the AMP_S signal.

From a period T6 in FIG. 4, the column circuit 105 performs the AD conversion on the AMP_S signal. The period T6 in FIG. 4 starts at the timing when the comparator 302 starts to compare between the ramp signal Vcomp and the AMP_S signal. The comparator 302 outputs the L-level comparison result signal CMP to the counter 303 through the switch Sw1. The counter 303 counts up while the comparison result signal CMP is at the L level.

In a period T7 in FIG. 4, the potential of the ramp signal Vcomp is higher than that of the AMP_S signal. Therefore, the comparison result signal CMP is at the H level. The timing when the signal value of the comparison result signal CMP changes from the L level to the H level is the timing when the comparator 302 finishes comparing between the ramp signal Vcomp and the AMP_S signal. Thus, the counter 303 stops to count and holds the count signal at this time. The count signal held by the counter 303 at this time corresponds to the digital signal based on the AMP_S signal. The digital signal obtained from the first AD conversion of the AMP_S signal is expressed as the DS1 signal.

On the other hand, another column circuit 105, which is different from the column circuit 105 operating according to the timing chart of FIG. 4, may have the larger amplitude of the AMP_S signal than in the column circuit described with reference to FIG. 4. Therefore, in the other column circuit 105, the comparison between the AMP_S signal and the ramp signal Vcomp is continued even after the period T7. Accordingly, the potential keeps changing depending on the time of the ramp signal Vramp output from the column circuit control unit 106.

In the column circuit 105 operating according to the timing chart of FIG. 4, the amplitude of the S signal is smaller than in the other columns; therefore, the generation of the digital signal based on the AMP_S signal ends before the other column circuits 105. The column circuit 105 operating according to the timing chart of FIG. 4 performs the second AD conversion on the AMP_S signal while the other column circuits 105 performs the AD conversion on the AMP_S signal.

In a period T8 in FIG. 4, the column circuit control unit 106 sets the signal clmp_1st and the signal clmp at the H level. Thus, the signal value of the comparison result signal CMP when the signal clmp_1st transits from the L level to the H level is stored in the flipflop circuit FF1 and moreover the signal corresponding to the signal value of the comparison result signal CMP is output from the Q terminal. In this case, the flipflop circuit FF1 outputs the H-level signal.

In the column circuit 105 operating according to the timing chart of FIG. 4, the comparison result signal CMP becomes the H level before the signal clmp_1st transits from the L level to the H level. Since the signal clmp and the signal input from the flipflop circuit FF1 are both at the H level, the AND circuit AG1 outputs the H-level signal. Thus, the switch Sw1 is turned off and the switch Sw2 that operates exclusively relative to the switch Sw1 is turned on. Accordingly, the signal output from the Q terminal of the flipflop circuit FF1 is input to the counter 303 instead of the comparison result signal CMP. Note that the signal output from the Q terminal of the flipflop circuit FF1 is also input to the horizontal scanning circuit 107. As described below, the signal of the flipflop circuit FF1 input to the horizontal scanning circuit 107 is used for determining whether the output unit 110 calculates the count signal of the counter 303.

Since the signal output from the AND circuit AG1 is at the H level, the signal output from the OR circuit OG1 is at the H level. Therefore, the switch Sw3 is turned on. Accordingly, the ramp signal Vramp is clamped again at the reference voltage Vref. This makes the ramp signal Vcomp have a potential with the initial value. The clamp capacitor Cclmp is a ramp signal processing unit that shifts the potential of the ramp signal Vcomp from the potential of the ramp signal Vramp in the period T8 in FIG. 4 to the potential at the start time of the period T3 at which the ramp signal Vramp starts to change in potential. By shifting the potential of the ramp signal Vcomp by the ramp signal processing unit, the comparison result signal CMP becomes the L level. However, as described above, the output of the flipflop circuit FF1 is input to the counter 303 instead of the comparison result signal CMP. Thus, the countup of the counter 303 does not start at this time.

In a period T9 in FIG. 4, the column circuit control unit 106 sets the signal clmp at the L level. This sets the output of the AND circuit AG1 at the L level to turn off the switch Sw3. Thus, the clamp operation of the ramp signal Vramp ends, whereby the potential of the ramp signal Vcomp changes depending on the time. At the same time, the switch Sw1 is turned on and the switch Sw2 is turned off. Thus, the count operation of the counter 303 begins to be controlled by the signal value of the comparison result signal CMP. Since the comparison result signal CMP is at the L level, the counter 303 performs the count operation. The signal PU/D is at the H level in this period; therefore, the counter 303 performs the countup. As a result, the AD conversion of the AMP_S signal is conducted again. Thus, the digital signal obtained by integrating the digital signal obtained in the second AD conversion of the AMP_S signal with respect to the DS1 signal can be acquired. This digital signal is referred to as a DS2 signal below. The DS2 signal is a signal obtained by integrating the count signal based on the AMP_S signal with the DS1 signal. A plurality of digital signals based on the AMP_S signal is collectively expressed by the DS signal.

The operation in a period T10 in FIG. 4 is the same as the operation in the period T7 described above.

The operation in a period T11 in FIG. 4 is the same as that in the period from T8 to T10 except that the signal clmp_1st remains at the L level. In the period T11, the signal clmp_1st remains at the L level but the output of the Q terminal of the flipflop circuit FF1 maintains the state changed in the period T8. Thus, even though the column circuit control unit 106 maintains the signal clmp_1st at the L level, the column circuit 105 performs the same operation as the operation in the period from T8 to T10.

After that, every time the signal clmp transits from the L level to the H level, the column circuit 105 repeats the operation in the period from T8 to T10. The counter 303 integrates the count signal value every time.

Next, the operation of the column circuit 105 with larger amplitude of the S signal to be input than in the column circuit 105 operating according to the timing chart of FIG. 4 is described with reference to FIG. 5.

In FIG. 5, the operation in the period from T1 to T6 is the same as the operation in the period from T1 to T6 of FIG. 4. However, since the amplitude of the S signal is larger than that of the column circuit 105 operating according to the timing chart of FIG. 4, the comparison result signal CMP remains at the L level in the period from T7 to T9.

In the period T8 in FIG. 5, the column circuit control unit 106 outputs the signal clmp_1st and the signal clmp at the H level to the column circuit 105 in a manner similar to the operation in the period T8 in FIG. 4. Thus, the flipflop circuit FF1 stores the signal value of the comparison result signal CMP when the signal clmp_1st transits from the L level to the H level and the Q terminal outputs the signal corresponding to the signal value of the comparison result signal CMP. In this case, the flipflop circuit FF1 outputs the L-level signal.

Since the output of the flipflop circuit FF1 is at the L level, the AND circuit AG1 keeps outputting the L-level signal. Therefore, the switch Sw1 maintains to be in the on state and the switch Sw2 operating exclusively relative to the switch Sw1 maintains to be in the off state. Accordingly, the comparison result signal CMP is input to the counter 303 subsequently. Thus, the counter 303 continues the countup. The AND circuit AG1 outputs the signal to the switch Sw3 through the OR logic gate; however, since the output of the flipflop circuit FF1 and the signal rst_colm are at the L level, the switch Sw3 maintains to be in the off state. Thus, the potential of the ramp signal Vcomp keeps changing depending on the time.

In the period T10 in FIG. 5, the ramp signal Vcomp outweighs the AMP_S signal. Therefore, the comparison result signal CMP is set at the H level and the counter 303 therefore stops to count up and holds the counted value at this time. On this occasion, the signal value of the count signal held by the counter 303 at this time is the digital signal based on the difference between the AMP_S signal and the AMP_N signal, i.e., the digital signal based on the signal in which the component of the N signal included in the S signal and the offset component of the column circuit 105 are reduced.

In the period T11 in FIG. 5, the column circuit control unit 106 sets the signal clmp at the H level again; however, the output of the flipflop circuit FF1 maintains the state stored in the period T8. Therefore, even though the signal value of the comparison result signal CMP has changed after the period T9, the column circuit 105 operating according to the timing chart of FIG. 5 does not conduct the multiple AD conversions on the AMP_S signal.

After that, the digital signals are sequentially output from the counter 303 in each column by the horizontal scanning circuit 107.

On this occasion, in regard to the column circuit 105 in which the output of the flipflop circuit FF1 is at the H level, the digital signal is divided by the number of times n of the integration. This produces the average value of a plurality of DS signals. As a result, the random noise of the column circuit 105 is reduced to $1/\sqrt{n}$, whereby the image quality can be improved. Here, when the number of times of integration is set to the m-th power of 2, the division can be made by shifting the signal of each bit lower by m bits; thus, the circuit of the signal processing can be simplified.

Since the digital signal of the column circuit 105 in which the output of the flipflop circuit FF1 is at the L level is not subjected to the plurality of AD conversions, the output unit 110 outputs the digital signal out of the image pickup device 100 without dividing the digital signal.

In the image pickup device of this embodiment, the effect of reducing the random noise can be achieved more as the AD conversion is repeated for the AMP_S signal.

The image pickup device of this embodiment includes the column circuit 105 that performs the AD conversion on one analog signal a plurality of times based on the incident light in the period where the potential of the ramp signal Vramp is changed depending on the time. From another point of view, in the image pickup device of this embodiment, while the comparator 302 of a certain column circuit 105 makes the comparison, the comparator 302 of another column circuit 105 compares the same analog signal a plurality of times based on the incident light. Thus, the image pickup device of this embodiment can provide a signal with the random noise reduced while suppressing the extension of the AD conversion period.

Note that the timing at which the column circuit control unit 106 transits the level of the signal clmp_1st from the L level to the H level is decided based on the level of the S signal where the optical shot noise becomes dominant as compared to the readout noise of the column circuit 105.

In this embodiment, the ramp signal Vramp generated in the column circuit control unit 106 is output to each column in common; on the other hand, the ramp signal Vcomp that is different for each column circuit 105 is input by the operation of the switch Sw3. This can reduce the number of transmission lines of the ramp signal Vramp as compared to the structure in which the ramp signal Vramp is output individually for each column. Accordingly, the deterioration in AD conversion accuracy due to the variation in resistance and capacitance between the transmission lines of the ramp signal can be suppressed. Moreover, the circuit area for the column circuit control unit 106 and the column circuit 105 can be reduced and the yield can be improved in the image pickup device.

Here, the example has been described in which the output unit 110 averages the plurality of DS signals. As another example, the signals may be averaged using a signal processing circuit provided outside the image pickup device. Alternatively, after the digital signal for each column is output to the outside of the image pickup device, the output of the flipflop circuit FF1 of each column may be output to the outside of the image pickup device.

Second Embodiment

An image pickup device of this embodiment is described mainly on the different point from the device of the first embodiment.

A structure of the image pickup device of this embodiment is the same as that of FIG. 1 except that the signal line outputting the signal clmp_1st to the column circuit 105 is omitted from the column circuit control unit 106.

Figure 6:
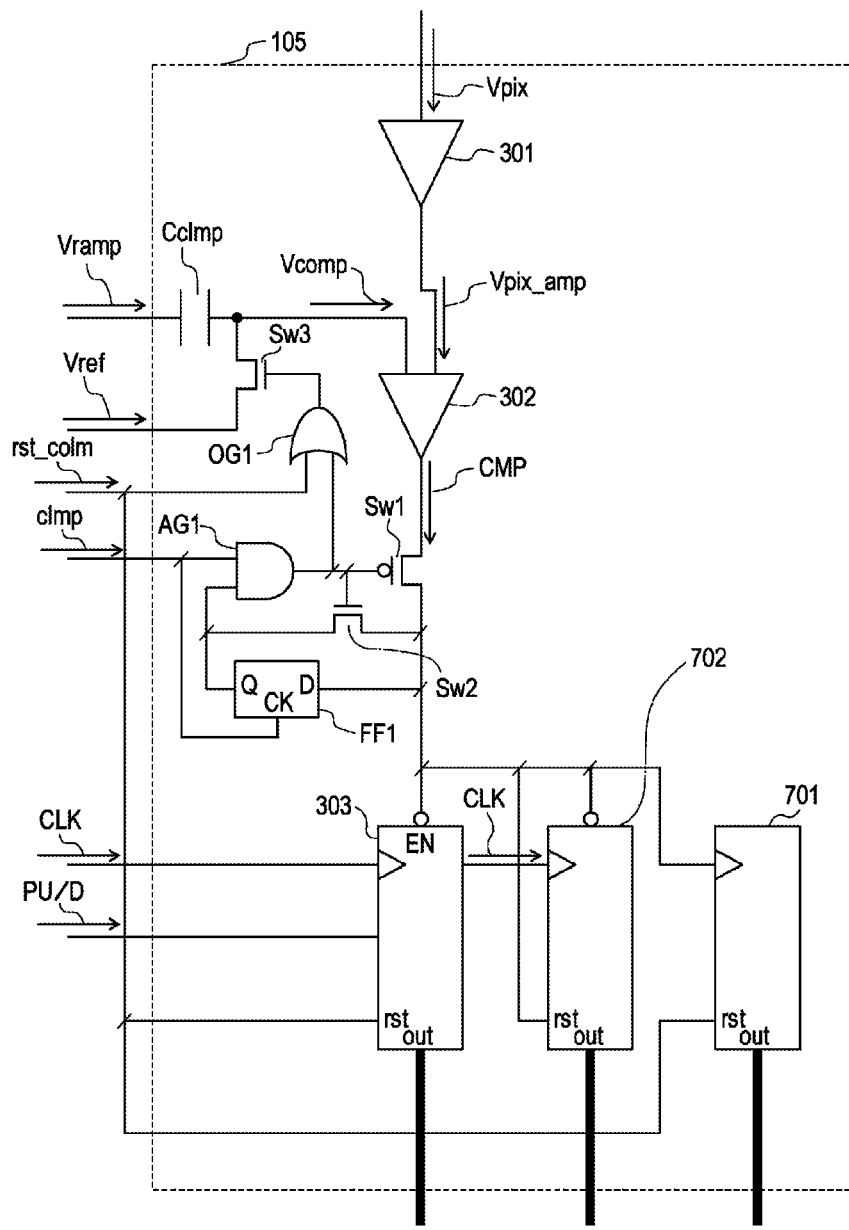
FIG. 6 is a diagram illustrating an example of the structure of the column circuit.

FIG. 6 illustrates a structure of the column circuit 105 of this embodiment. In FIG. 6, the member with the same function as that of FIG. 3 is denoted by the same reference symbol as that of FIG. 3.

As compared to the structure of FIG. 3, the column circuit 105 of FIG. 6 is different in that the CK of the flipflop circuit FF1 is connected to the transmission line that transmits the signal clmp and that the column circuit 105 further includes a counter 701 and a Buf counter 702.

The counter 701 is a third counter that counts the number of times of integrating the digital signals based on the AMP_S signal.

The column circuit control unit 106 outputs the signal rst_colm common to the counter 303 to the counter 701. Therefore, the count signals are reset at the same time in the counter 303 and in the counter 701. The clock line of the countup of the counter 701 is connected to the node common to the D terminal of the flipflop circuit FF1. Therefore, every time the output of the comparison result signal CMP is changed, the count signal of the counter 701 is increased by one.

The Buf counter 702 counts up from 0, the initial value, every time the AD conversion based on the same incident light is repeated n times (n is an integer of 2 or more). The n-th AD conversion may not finish at the timing when the change in potential of the ramp signal Vramp depending on the time ends. In this case, the process is performed that returns the count signal, where the count operation has advanced to the middle of the n-th AD conversion, to the signal value of the count signal obtained in the (n−1)-th AD conversion. Specifically, the count signal of only the n-th conversion held by the Buf counter 702 is subtracted from the count signal obtained by integrating the signals from the conversions up to the middle of the n-th conversion held by the Buf counter 303. Therefore, the image pickup device of this embodiment has the Buf counter 702 that holds the count signal obtained by the column circuit 105 in the n-th AD conversion only. In other words, the Buf counter 702 is the second counter that counts the next comparison clock signal CLK after resetting the count signal generated from the previous comparison.

The Buf counter 702 resets the count signal to the initial value when the comparison result signal CMP is set to the H level.

Figure 7:
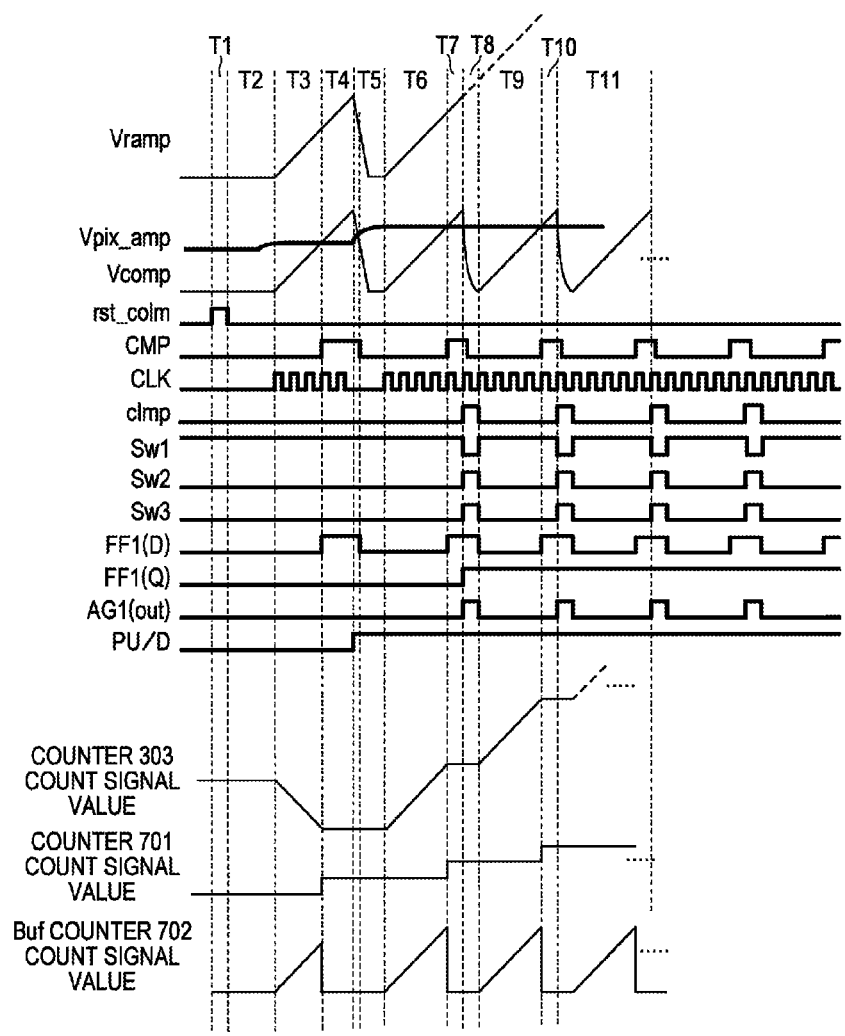
FIG. 7 is a diagram illustrating an example of the operation of the image pickup device.

FIG. 7 is a diagram for describing the operation of the image pickup device of this embodiment. FIG. 7 illustrates the operation of the column circuit 105 that compares the analog signals based on the same incident light a plurality of times in a period from when the potential of the ramp signal Vramp starts to change depending on the time to when the change ends.

The operation in FIG. 7 is different from that in FIG. 4 in that the signal clmp_1st is omitted and the operations of the counter 701 and the Buf counter 702 are added.

The flipflop circuit FF1 stores the signal value of the comparison result signal CMP every time the level of the signal clmp transits from the L level to the H level. However, in the operation of FIG. 7, the comparison result signal CMP is at the H level at the timing where the level of the signal clmp transits from the L level to the H level. Therefore, the operation in FIG. 7 is the same as that in FIG. 4 except the operations of the additional components, the counter 701 and the Buf counter 702.

The counter 701 increases the signal value of the count signal by one when the comparison result signal CMP is set to the H level. The Buf counter 702 resets the count signal when the comparison result signal CMP is set to the H level. The counter 701 starts to count up at the same time as when the counter 303 starts to count up.

Figure 8:
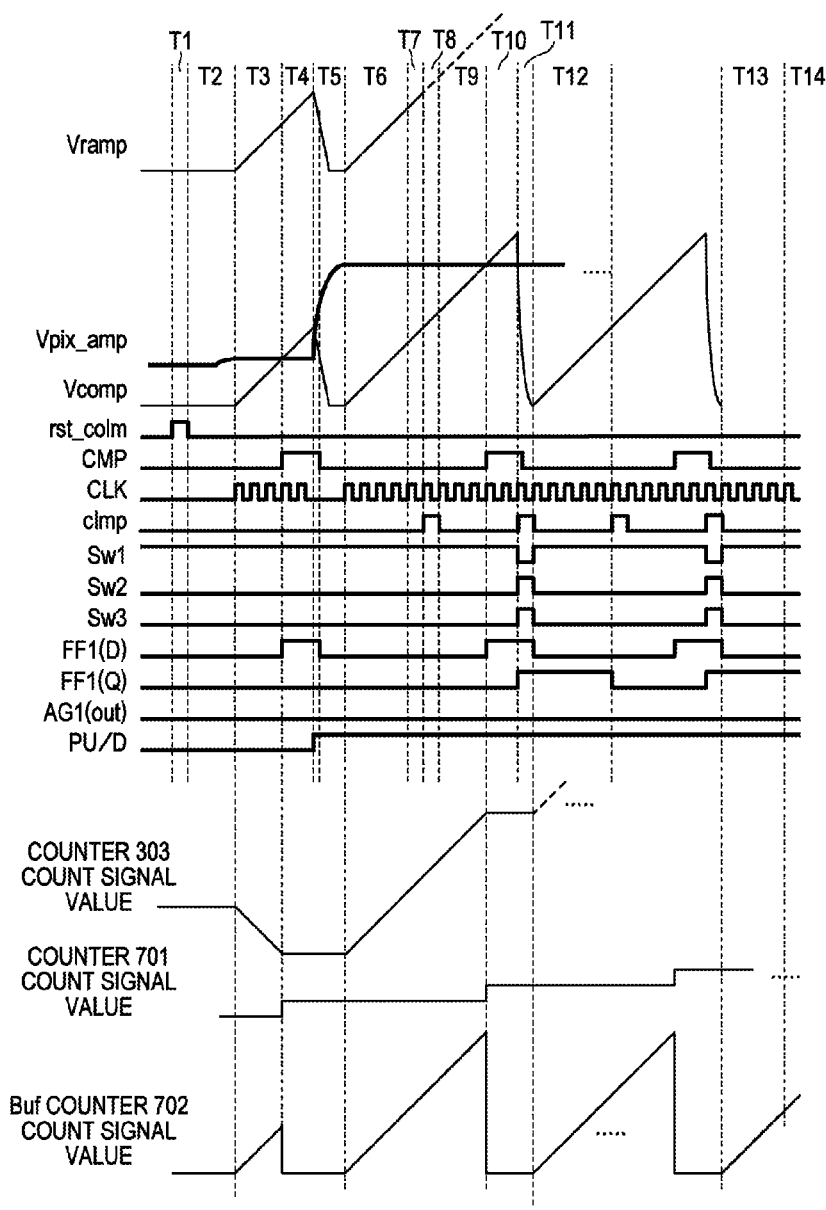
FIG. 8 is a diagram illustrating an example of the operation of the image pickup device.

FIG. 8 is a timing chart illustrating the operation of the column circuit 105 with the larger amplitude of the S signal than in the column circuit 105 operating according to FIG. 7.

The column circuit control unit 106 sets the signal clmp at the H level in the period T8 and at this time, the comparison result signal CMP remains at the L level. Therefore, the output of the AND circuit AG1 remains at the L level and the on/off state of the switch Sw1, the switch Sw2, and the switch Sw3 do not change either. Thus, the potential of the ramp signal Vcomp keep changing depending on the time and the counter 303 continues to count up. This state similarly applies to the period T9.

In the operation in FIG. 8, the counter 701 increases the signal value of the count signal by one when the comparison result signal CMP is set to the H level. The Buf counter 702 resets the count signal when the comparison result signal CMP is set to the H level. The counter 701 starts to count up at the same time as the start of the countup of the counter 303.

Here, description is made of the case in which the column circuit control unit 106 ends the change in potential of the ramp signal Vramp depending on the time in a period T14. The column circuit control unit 106 stops the output of the clock signal CLK at the same time as the end of the change in potential of the ramp signal Vramp depending on the time. At this time, the countup of the counter 303 and the Buf counter 702 stops in the column circuits 105 in which the comparison result signal CMP remains at the L level in the n-th AD conversion, and the count signal at this time is held in each. On this occasion, the counted value of the counter 303 holds the count signal obtained by integrating the count signals until the period T13 and the count signal in the middle of the n-th AD conversion. On the other hand, the Buf counter 702 holds the count signal in the middle of the n-th AD conversion. The horizontal scanning circuit 107 reads out the count signal held by the counter 303 and the count signal held by the Buf counter 702. The output unit 110 generates the differential signal obtained by subtracting the count signal held by the Buf counter 702 from the count signal held by the counter 303. In addition, the horizontal scanning circuit 107 reads out the count signal held by the counter 701. Then, the output unit 110 divides the generated differential signal by the signal value of the count signal held by the counter 701. Thus, even in the case where the n-th AD conversion ends on its way, the count signals obtained up to the (n–1)-th AD conversion can be averaged in the image pickup device of this embodiment.

In this manner, as compared to the image pickup device of the first embodiment, the image pickup device of this embodiment can deal with the case in which the AD conversion ends on its way. Thus, in the image pickup device of this embodiment, the degree of freedom in setting the number of times of performing the AD conversion on the analog signal based on the same incident light can be improved.

Note that in this embodiment, the pixel 102 outputs the N signal before the S signal; however, the order may be the opposite. In this case, the number of times of performing the AD conversion on the N signal may be set based on the number of times of performing the AD conversion on the S signal. In this case, the random noise included in the digital signal based on the N signal can be reduced by averaging the plurality of digital signals based on the N signal.

Figure 9:
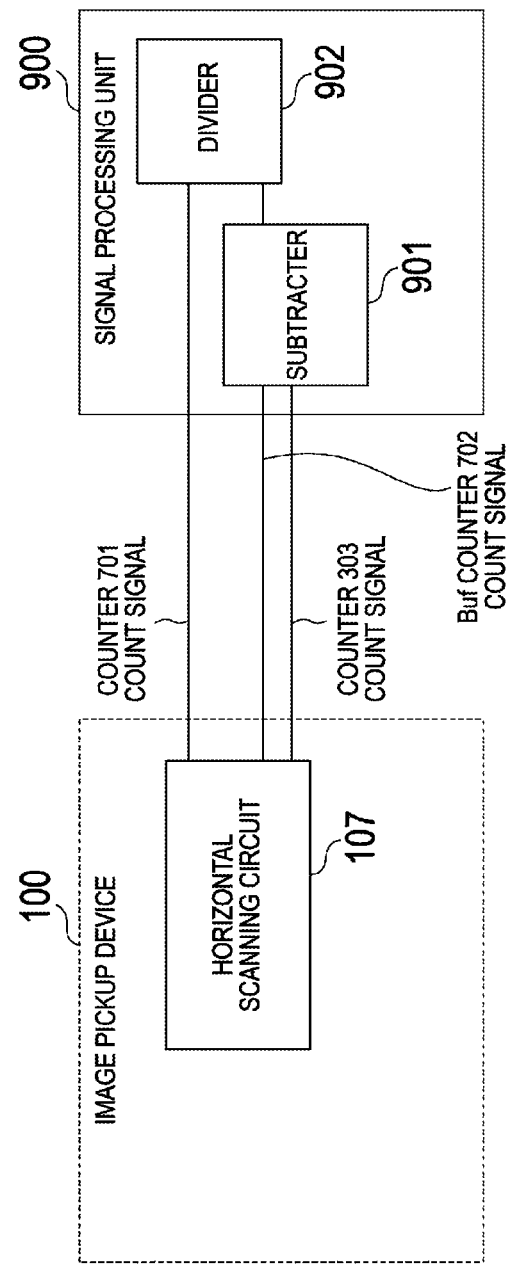
FIG. 9 is a diagram illustrating an example of the structure of an image pickup system.

In this embodiment, the output unit 110 obtains the difference between the count signals of the counter 701 and the Buf counter 702, and divides the difference by the count signal value of the counter 701. In another example, a signal processing unit 900 provided outside the image pickup device may perform this operation. FIG. 9, which illustrates this example, is a diagram of an image pickup system having the image pickup device 100 and the signal processing unit 900. The output unit 110 outputs the count signals of the counter 701, the Buf counter 702, and the counter 303 in each column to the signal processing unit 900. The signal processing unit 900 includes a subtracter 901 and a divider 902. To the subtracter 901, the count signals of the counter 303 and the count signal of the Buf counter 702 are input. The subtracter 901 generates a differential signal by subtracting the count signal of the Buf counter 702 from the count signal of the counter 701. Then, the subtracter 901 outputs the differential signal to the divider 902. The count signal of the counter 701 is further input to the divider 902.

The divider 902 divides the differential signal input from the subtracter 901 by the count signal of the counter 701. Thus, the signal processing unit 900 can average the count signals obtained in the AD conversion up to the (n–1)-th time.

Third Embodiment

Description is made of the different point from the first embodiment.

In this embodiment, the column circuit control unit 106 outputs the ramp signal Vramp and a ramp signal Vramp2, whose amount of change in potential depending on time is different, to the column circuits 105. The other structure of the image pickup device is the same as that of FIG. 1.

Figure 10:
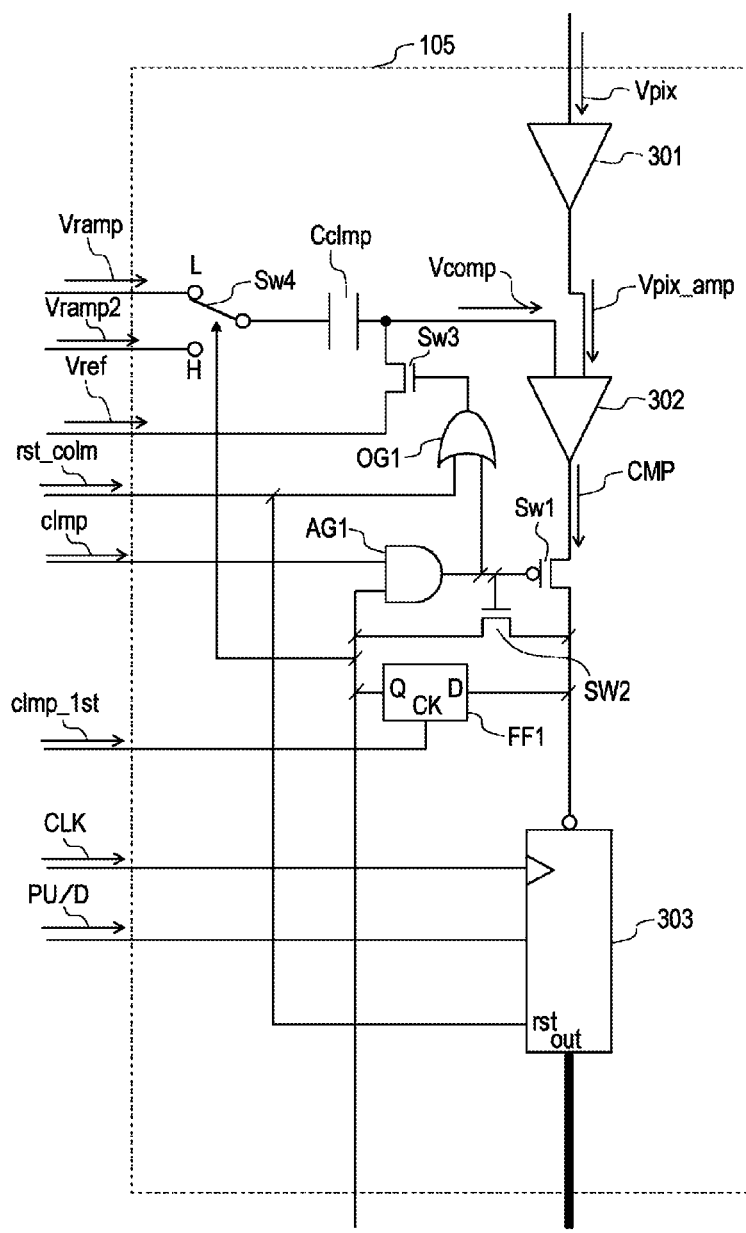
FIG. 10 is a diagram illustrating an example of the structure of the column circuit.

FIG. 10 illustrates the structure of the column circuit 105 of this embodiment. The ramp signal Vramp2 is a ramp signal whose amount of change in potential per unit time is ½ of that of the ramp signal Vramp. Each of the column circuits 105 has a switch Sw4 corresponding to a ramp signal selecting unit that selects one of the ramp signal Vramp and the ramp signal Vramp2 as the ramp signal to be output to the clamp capacitor Cclmp. The switch Sw4 is controlled by the output of the Q terminal of the flipflop circuit FF1. The switch Sw4 outputs the ramp signal Vramp to the clamp capacitor Cclmp while the output of the Q terminal of the flipflop circuit FF1 is at the L level. On the other hand, the switch Sw4 outputs the ramp signal Vramp2 to the clamp capacitor Cclmp while the output of the Q terminal of the flipflop circuit FF1 is at the H level.

Figure 11:
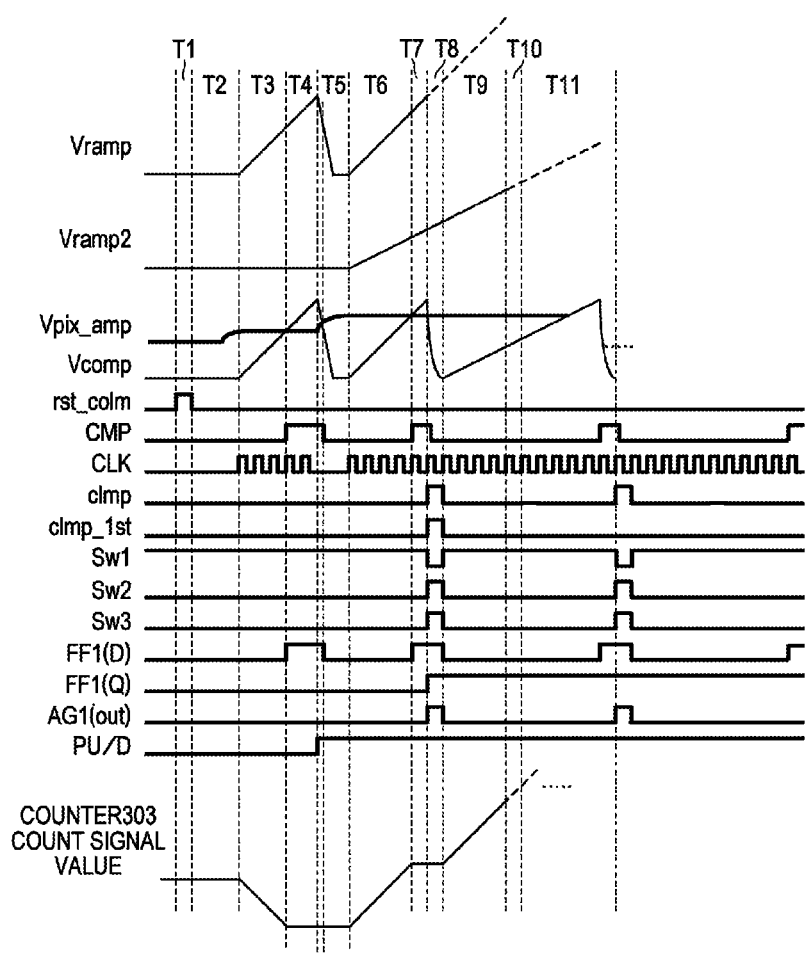
FIG. 11 is a diagram illustrating an example of the operation of the image pickup device.

FIG. 11 is a timing chart illustrating the operation of the image pickup device of this embodiment. Description is made of the different point from the timing chart of FIG. 4.

The operation in the period from T1 to T7 in FIG. 11 is the same as that in the period from T1 to T7 in FIG. 4.

When the output of the Q terminal of the flipflop circuit FF1 has become the H level at the start of the period T8 in FIG. 11, the switch Sw4 switches the signal to be output to the clamp capacitor Cclmp from the ramp signal Vramp to the ramp signal Vramp2. Thus, the amount of change in potential per unit time of the ramp signal Vcomp to be input to the comparator 302 in the period T9 is halved relative to the amount of change in potential per unit time of the ramp signal Vcomp in the period T6. By the use of the ramp signal Vramp2 for the comparison in the period T9, the resolution of the digital signal based on the AMP_S signal that is obtained in the second or later AD conversion can be improved to be higher than the resolution of the digital signal obtained in the first AD conversion. In the image pickup device, the noise compositions of the pixel 102 and the column circuit 105 become larger relatively as the amount of incident light is decreased; therefore, the S/N ratio of the digital signal is deteriorated. In the image pickup device, however, the deterioration in S/N ratio of the digital signal can be suppressed by performing the AD conversion on the AMP_S signal based on the S signal of the low-luminance pixel 102 with the high resolution.

This embodiment has described the example in which the ramp signal Vramp2 is used in the second or later AD conversion of the AMP_S signal based on the same incident light; however, in another example, the ramp signal Vramp and the ramp signal Vramp2 may be switched and used as the ramp signal to be used in the second or later AD conversion in accordance with the amplitude of the AMP_S signal. For example, in the case of putting priority on the reduction of the random noise, the ramp signal Vramp may be used for increasing the number of times of the AD conversion as much as possible. In the case of putting priority to the higher S/N ratio at the low luminance, the ramp signal Vramp2 may be used.

Fourth Embodiment

Figure 12:
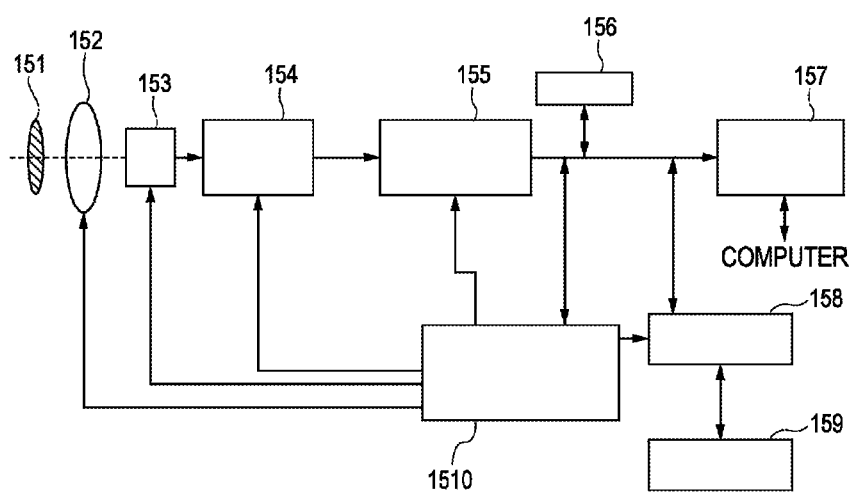
FIG. 12 is a diagram illustrating an example of a structure of an image pickup system.

Description is made of an embodiment in which the image pickup device according to the first to third embodiments is applied to an image pickup system. The image pickup system corresponds to a digital still camera, digital camcorder, a surveillance camera, or the like. FIG. 12 is a schematic diagram of the case in which the image pickup device is applied to the digital still camera as an example of the image pickup system.

In FIG. 12, the image pickup system includes a lens 152 for focusing an optical image of a subject on an image pickup device 154, a barrier 151 for protecting the lens 152, and a diaphragm 153 for varying the quantity of light transmitting through the lens 152. The lens 152 and the diaphragm 153 correspond to an optical system that guides the light to the image pickup device 154. The image pickup system further includes an output signal processing unit 155 processing an output signal to be output from the image pickup device 154.

The output signal processing unit 155 includes a digital signal processing unit, and corrects or compresses a signal output from the image pickup device 154 as necessary and then outputs the signal. The output signal processing unit 155 herein referred to corresponds to the output signal processing unit of the image pickup system described in the first embodiment.

The image pickup system moreover includes a buffer memory unit 156 for storing image data temporarily, and a storage medium control interface unit 158 for recording the data in the recording medium or reading out the data from the recording medium. The image pickup system further includes a recording medium 159 that is detachable, such as a semiconductor memory, for recording the image data therein or reading out the data therefrom. In addition, the image pickup system includes an external interface unit 157 for communicating with an external computer or the like, an overall control/calculation unit 1510 for performing various calculations and controlling the entire digital still camera, and the image pickup device 154. The image pickup system includes a timing generation unit 1511 for outputting various timing signals to the output signal processing unit 155. The timing signals and the like may be input from the outside, and the image pickup system may include at least the image pickup device 154, and the output signal processing unit 155 that processes the output signal output from the image pickup device 154. In the case of the image pickup device illustrated in FIG. 4, the output signal processing unit 155 can process a focus detection signal. Moreover, the output signal processing unit 155 can generate the image from the digital signal based on A+B signal.

As thus described, the image pickup system of this embodiment can perform the image pickup operation by applying the image pickup device 154.

The output signal processing unit 155 may have the signal processing unit 900 described in the second embodiment.

Note that this specification has described the example in which the column circuit 105 has the amplifier 301; however, the present invention is not limited to this example. In other words, the signal output from the pixel 102 may be input to the comparator 302 without being amplified.

In this specification, description has been made based on the case in which the column circuit control unit 106 generates the ramp signal whose potential changes in the slope-like shape; however, the present invention is not limited thereto. In another example, the column circuit control unit 106 may generate the ramp signal whose potential changes in a step-like shape. The ramp signal whose potential changes in a step-like shape is also the ramp signal whose potential changes over the time.

The above embodiment merely illustrates the specific example of the present invention, and the technical scope of the present invention is not limited thereby. In other words, various modifications can be made without departing from the technical thought and principal features of the present invention.

According to the present invention, the image pickup device in which the random noise included in the signal output from the image pickup device is reduced while the extension of the AD conversion period is suppressed can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-248032, filed Nov. 29, 2013, which is hereby incorporated by reference herein in its entirety.

What is claimed is:

1. An image pickup device comprising:
   a plurality of pixels including a first pixel and a second pixel each outputting a pixel signal based on incident light;
   a ramp signal output unit configured to output a ramp signal whose potential changes in a ramp changing period that is from a start to an end of a change in potential of the ramp signal; and
   a plurality of AD converters including a first AD converter and a second AD converter each having a comparator that outputs a comparison result signal by comparing the ramp signal and the pixel signal, the first AD converter generating a digital signal based on the pixel signal output from the first pixel, based on changing of a signal value of the comparison result signal of the first AD converter, the second AD converter generating a digital signal based on the pixel signal output from the second pixel, based on changing of a signal value of the comparison result signal of the second AD converter,
   wherein the signal value of the comparison result signal of the first AD converter changes a plurality of times in a period for which the signal value of the comparison result signal of the second AD converter changes once, and the period is included in the ramp changing period.

2. The image pickup device according to claim 1, wherein:
   the first AD converter has a ramp signal processing unit; and
   the ramp signal processing unit shifts the potential of the ramp signal used in the comparison, from the potential input to the ramp signal processing unit to a second potential which starts to change depending on time on the basis of change in signal value of the comparison result signal of the first AD converter, and outputs the second potential to the comparator of the first AD converter.

3. The image pickup device according to claim 2, wherein:

the ramp signal processing unit is a capacitor with one node and another node;

the ramp signal is input to the one node; and the capacitor clamps the ramp signal by an input of reference voltage to the other node.

4. The image pickup device according to claim 1, wherein:

the first AD converter has a counter that generates a count signal obtained by counting a clock signal in a conversion period for which the first AD converter compares the ramp signal and the pixel signal; and the counter of the first AD converter integrates the count signal in each time of changing the signal value of the comparison result signal of the first AD converter.

5. The image pickup device according to claim 4, further comprising an output unit, wherein the output unit generates a signal obtained by dividing the count signal integrated by the counter of the first AD converter by the number of times of changing the signal value of the comparison result signal of the first AD converter.

6. The image pickup device according to claim 4, wherein:

the first AD converter has a second counter that generates a count signal obtained by counting the clock signal in the conversion period including a first period and a second period, the second period being a period after the first period; and the second counter of the first AD converter resets the count signal generated in the first period from starting of the period to changing the signal value of the comparison result signal of the first AD converter, and then counts the clock signal in the second period.

7. The image pickup device according to claim 5, wherein:

the first AD converter has a second counter that generates a count signal obtained by counting the clock signal in the conversion period including a first period and a second period, the second period being a period after the first period;

the second counter of the first AD converter resets the count signal generated in the first period from starting of the period to changing the signal value of the comparison result signal of the first AD converter, and then counts the clock signal in the second period; and in the case where the signal value of the comparison result signal in the second period has remained the same since the start of the n-th comparison at the end of the change in potential depending on time of the ramp signal output from the ramp signal output unit, the count signal is generated by subtracting the count signal generated in the second period by the second counter from the count signal generated in the conversion period by the counter.

8. The image pickup device according to claim 1, wherein:

the ramp signal output unit outputs a first ramp signal whose potential changes in a first change amount per unit time and a second ramp signal whose potential changes in a second change amount which is smaller amount than the first change amount per unit time;

each of the plurality of AD converters includes a ramp signal selection unit that selects one of the first ramp signal and the second ramp signal to be input to the comparator; and the ramp signal selection unit of each of the plurality of AD converters selects the first ramp signal and the comparator performs the comparison with the first ramp signal, and then the ramp signal selection unit of the first AD converter selects the second ramp signal and the comparator of the first AD converter performs the comparison with the second ramp signal.

9. The image pickup device according to claim 1, wherein:

the first pixel outputs a reset level signal;

the first AD converter performs a second comparison for comparing the ramp signal and the reset level signal for the same number of times as the number of times of changes of the signal value of the comparison result signal in the first AD converter.

10. The image pickup device according to claim 1, further comprising a plurality of amplifiers provided corresponding to the plurality of pixels, wherein each of the amplifiers amplifies the pixel signal output from the corresponding pixel and outputs the pixel signal to the comparator of one of the plurality of AD converters.

11. The image pickup device according to claim 1, wherein the first AD converter includes a third counter that counts the number of times of changes of the comparison result signal of the first AD converter.

12. An image pickup system comprising:

an image pickup device; and a signal processing unit that processes a signal output from the image pickup device and generates an image, wherein the image pickup device comprises:

a plurality of pixels including a first pixel and a second pixel each outputting a pixel signal based on incident light;

a ramp signal output unit configured to output a ramp signal whose potential changes in a ramp changing period that is from a start to an end of a change in potential of the ramp signal; and a plurality of AD converters including a first AD converter and a second AD converter each having a comparator that outputs a comparison result signal by comparing the ramp signal and the pixel signal, the first AD converter generating a digital signal based on the pixel signal output from the first pixel, based on changing of a signal value of the comparison result signal of the first AD converter, the second AD converter generating a digital signal based on the pixel signal output from the second pixel, based on changing of a signal value of the comparison result signal of the second AD converter, wherein the signal value of the comparison result signal of the first AD converter changes a plurality of times in a period for which the signal value of the comparison result signal of the second AD converter changes once, and the period is included in the ramp changing period.

13. The image pickup system according to claim 12, wherein:

the first AD converter has a ramp signal processing unit; and the ramp signal processing unit shifts a potential of the ramp signal used in a conversion period for which the first AD converter compares the ramp signal and the pixel signal, from a potential inputs to the ramp signal processing unit to a second potential which starts to change depending on the time on the basis of change in signal value of the comparison result signal of the first AD converter, and outputs the second potential to the comparator of the first AD converter.

14. The image pickup system according to claim 13, wherein:

the ramp signal processing unit is a capacitor with one node and another node;

the ramp signal is input to the one node; and the capacitor clamps the ramp signal by an input of reference voltage to the other node.

15. The image pickup system according to claim 12, wherein:

the first AD converter has a counter that generates a count signal obtained by counting a clock signal in a conversion period for which the first AD converter compares the ramp signal and the pixel signal; and the counter of the first AD converter integrates the count signal in each time of changing the signal value of the comparison result signal of the first AD converter.

16. The image pickup system according to claim 15, further comprising an output unit, wherein the output unit generates a signal obtained by dividing the count signal integrated by the counter of the first AD converter by the number of times of changing the signal value of the comparison result signal of the first AD converter.

17. The image pickup system according to claim 15, wherein the image pickup device includes an output unit.

18. The image pickup device according to claim 1, wherein a signal range of the ramp signal input to the comparator of the first AD converter is narrower than a signal range of the ramp signal input to the comparator of the second AD converter.

* * * * *